United States Patent
Wan et al.

(10) Patent No.: US 10,509,286 B2
(45) Date of Patent: Dec. 17, 2019

(54) PIXEL STRUCTURE AND MANUFACTURING METHOD THEREOF, ARRAY SUBSTRATE AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yunhai Wan, Beijing (CN); Chengshao Yang, Beijing (CN); Ling Han, Beijing (CN); Botao Song, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 4 days.

(21) Appl. No.: 15/518,911

(22) PCT Filed: Oct. 9, 2016

(86) PCT No.: PCT/CN2016/101546
§ 371 (c)(1),
(2) Date: Apr. 13, 2017

(87) PCT Pub. No.: WO2017/128765
PCT Pub. Date: Aug. 3, 2017

(65) Prior Publication Data
US 2018/0059456 A1    Mar. 1, 2018

(30) Foreign Application Priority Data

Jan. 26, 2016 (CN) .......................... 2016 1 0052345

(51) Int. Cl.
*H01L 21/28* (2006.01)
*G02F 1/1368* (2006.01)
(Continued)

(52) U.S. Cl.
CPC ............ *G02F 1/1368* (2013.01); *H01L 21/28* (2013.01); *H01L 21/768* (2013.01); *H01L 21/84* (2013.01);
(Continued)

(58) Field of Classification Search
CPC ..... G02F 1/1368; H01L 21/28; H01L 21/768; H01L 21/84; H01L 27/1214; H01L 29/49; H01L 29/786
(Continued)

(56) References Cited

U.S. PATENT DOCUMENTS 6,400,440 B1 * 6/2002 Colgan ............. G02F 1/133707
349/110
6,900,872 B2 * 5/2005 Kang ................ G02F 1/136209
349/141
(Continued)

FOREIGN PATENT DOCUMENTS

CN    1870216 A    11/2006
CN    1933128 A    3/2007
(Continued)

OTHER PUBLICATIONS

First Office Action dated Dec. 29, 2017 in corresponding Chinese Patent Application No. 201610052345.0.
(Continued)

*Primary Examiner* — Ori Nadav
(74) *Attorney, Agent, or Firm* — Nath, Goldberg & Meyer; Joshua B. Goldberg

(57) ABSTRACT

A manufacturing method of the invention, comprising: successively forming an insulation layer and a photoresist layer
(Continued)

on a transparent substrate; performing an exposure and a development on the photoresist layer by a back exposure process, so as to form a trench in the photoresist layer, an open area of the trench proximal to the insulation layer is larger than that of the trench distal to the insulation layer; removing a portion of insulation material in a region of the insulation layer exposed through the trench by an etching process, so as to form a slot in the insulation layer; forming a metal layer on a side of the photoresist layer distal to the insulation layer, a portion of the metal layer is embedded in the slot; removing the photoresist layer and the metal layer thereon by a stripping process, and retaining the portion of the metal layer in the slot.

14 Claims, 7 Drawing Sheets

(51) Int. Cl.
*H01L 29/786* (2006.01)
*H01L 21/768* (2006.01)
*H01L 21/84* (2006.01)
*H01L 27/12* (2006.01)
*H01L 29/49* (2006.01)

(52) U.S. Cl.
CPC .......... *H01L 27/1214* (2013.01); *H01L 29/49* (2013.01); *H01L 29/786* (2013.01)

(58) Field of Classification Search
USPC ........................................................ 257/59
See application file for complete search history.

(56) References Cited

U.S. PATENT DOCUMENTS

| | | | |
|---|---|---|---|
| 7,501,348 B2* | 3/2009 | Chen .................. | H01L 21/0272 257/E21.218 |
| 8,455,312 B2* | 6/2013 | Qiu .................... | H01L 21/28587 438/182 |
| 2005/0212115 A1* | 9/2005 | McKinnell .............. | H01L 23/26 257/700 |
| 2006/0231407 A1* | 10/2006 | Yao ......................... | C25D 5/022 205/118 |
| 2012/0018742 A1* | 1/2012 | Nishi ................ | H01L 21/76898 257/77 |
| 2012/0293883 A1 | 11/2012 | Wang et al. | |
| 2013/0250221 A1* | 9/2013 | Wu ........................ | G02F 1/1341 349/123 |
| 2014/0073137 A1* | 3/2014 | Cinnor ................ | H01L 21/0272 438/703 |
| 2015/0270290 A1 | 9/2015 | Wei et al. | |
| 2016/0254331 A1* | 9/2016 | Wang .................. | H01L 27/3246 257/40 |

FOREIGN PATENT DOCUMENTS

| | | |
|---|---|---|
| CN | 102645690 A | 8/2012 |
| CN | 103811558 A | 5/2014 |
| CN | 105428245 A | 3/2016 |
| TW | 201523150 A | 6/2015 |
| WO | 2015/016362 A1 | 2/2015 |

OTHER PUBLICATIONS

International Search Report dated Jan. 13, 2017 issued in corresponding International Application No. PCT/CN2016/101546.
Chinese office action dated Jun. 19, 2018 for corresponding application No. 201610052345.0 with English translation attached.

* cited by examiner

PIXEL STRUCTURE AND MANUFACTURING METHOD THEREOF, ARRAY SUBSTRATE AND DISPLAY APPARATUS

This is a National Phase Application filed under 35 U.S.C. 371 as a national stage of PCT/CN2016/101546, filed Oct. 9, 2016, an application claiming the benefit of Chinese Application No. 201610052345.0, filed Jan. 26, 2016, the content of each of which is hereby incorporated by reference in its entirety.

FIELD

The present invention relates to a field of display technology, and particularly, to a pixel structure and a manufacturing method thereof, an array substrate and a display apparatus.

BACKGROUND

With a development of display technology, a liquid crystal display (LCD) apparatus and an organic light emission display (OLED) apparatus become a mainstream of current display apparatus. The liquid crystal display apparatus is a flat panel display apparatus most widely used currently, and a main component thereof is a liquid crystal panel. The liquid crystal panel comprises a color filter substrate, an array substrate and liquid crystal molecules provided therebetween.

The array substrate is an important component of the liquid crystal display apparatus, and comprises a thin film transistor (TFT) and a pixel electrode connected to the thin film transistor. The pixel electrode is controlled to generate a corresponding electrical field by controlling on/off of the thin film transistor, so as to drive and control the liquid crystal molecules, thereby a picture is displayed. The thin film transistor is also an important control element of the organic light emission display apparatus.

As shown in FIG. 1, the thin film transistor generally comprises layer structures such as a gate layer 4, a gate insulation layer 2, an active layer 6, a source 7A and a drain 7B which are successively provided. During a manufacturing procedure of the thin film transistor, for example, due to a thickness (generally, about 4000 Å) of the gate layer 4, when the gate insulation layer 2 is deposited above the gate layer 4, a relative level difference is formed between the gate layer 4 and the gate insulation layer 2, so that the gate insulation layer 2 at edges of the gate layer 4 is easily to be cracked, resulting in a defect caused by an exposure of the gate layer 4. In view of this problem, a commonly used solution is to increase a thickness of the gate insulation layer 2 so as to prevent cracking thereof, but this solution cannot solve the problem fundamentally, and may result in an increase of process time and a risk of further raising problems in subsequent processes.

Therefore, currently, a technical problem to be solved urgently in the field of display technology is to provide a pixel structure with a reliable structure and a simple manufacturing process.

SUMMARY

In view of the problem existing in the prior art, an object of the present invention is to provide a pixel structure and a manufacturing method thereof, an array substrate and a display apparatus, the manufacturing method of the pixel structure does not need to bring in an additional mask plate and an additional patterning process, can effectively solve, for example, the problem that a gate insulation layer is easily to be cracked when the gate insulation layer is deposited on a gate, avoiding a risk of exposure of the gate due to cracking of the gate insulation layer, and moreover, the manufacturing method of the pixel structure has a simple process and can effectively improve production efficiency.

The manufacturing method of the pixel structure provided by the present invention comprises steps of: successively forming an insulation layer and a photoresist layer on a transparent substrate; performing an exposure and a development on the photoresist layer by a back exposure process, so as to form a trench in the photoresist layer, an open area of the trench proximal to the insulation layer is larger than that of the trench distal to the insulation layer; removing a portion of insulation material in a region of the insulation layer exposed through the trench by an etching process, so as to form a slot in the insulation layer; forming a metal layer on a side of the photoresist layer distal to the insulation layer, a portion of the metal layer is embedded in the slot; removing the photoresist layer and the metal layer thereon by a stripping process, and retaining the portion of the metal layer in the slot.

The photoresist layer may be a transparent layer.

During the back exposure process, a full-transmission mask plate may be used for performing the exposure, so that a cross section shape of the trench along a plane perpendicular to a plane of the transparent substrate is a trapezoid, and the trapezoid has two waists of straight lines.

The cross section shape of the trench along the plane perpendicular to the plane of the transparent substrate may be an isosceles trapezoid, and the isosceles trapezoid has two waists of straight lines.

Alternatively, during the back exposure process, a semi-transmission mask plate may be used for performing the exposure, so that the cross section shape of the trench along the plane perpendicular to the plane of the transparent substrate is a trapezoid, and the trapezoid has two waists of arc lines, the arc lines protrude toward an inside of the trench.

The cross section shape of the trench along the plane perpendicular to the plane of the transparent substrate may be an isosceles trapezoid, and the isosceles trapezoid has two waists of arc lines, the arc lines protrude toward the inside of the trench.

The pixel structure may comprise a thin film transistor, the insulation layer is a gate insulation layer of the thin film transistor, the metal layer embedded in the slot of the insulation layer is a gate layer of the thin film transistor, an active layer and a source and drain layer are further successively provided above the gate insulation layer.

An auxiliary gate insulation layer may be further provided between the gate insulation layer and the active layer, the auxiliary gate insulation layer may be formed of a material that is the same as that of the gate insulation layer and completely covers the gate insulation layer and the gate layer.

The pixel structure may comprises a thin film transistor, a pixel electrode layer and a passivation layer, the insulation layer is the passivation layer, and the metal layer embedded in the slot of the insulation layer is the pixel electrode layer.

The pixel structure of the present invention is manufactured by the manufacturing method of the present invention, and the pixel structure comprises the insulation layer and the metal layer embedded in the slot of the insulation layer.

The pixel structure may comprise a thin film transistor, the insulation layer is a gate insulation layer of the thin film transistor, the metal layer embedded in the slot of the insulation layer is a gate layer of the thin film transistor, an active layer and a source and drain layer are further successively provided above the gate insulation layer.

An auxiliary gate insulation layer may be further provided between the gate insulation layer and the active layer, the auxiliary gate insulation layer may be formed of a material that is the same as that of the gate insulation layer and completely covers the gate insulation layer and the gate layer.

The pixel structure may comprise a thin film transistor, a pixel electrode layer and a passivation layer, the insulation layer is the passivation layer, and the metal layer embedded in the slot of the insulation layer is the pixel electrode layer.

The array substrate of the present invention comprises the pixel structure of the present invention.

The display apparatus of the present invention comprises the array substrate of the present invention.

The present invention has following beneficial effects.

In the manufacturing method of the pixel structure in the present invention, the insulation layer and the metal layer embedded in the insulation layer are prepared by using the back exposure process, there is no need to bring in an additional mask plate and an additional patterning process, for example, the problem existing in the prior art that the gate insulation layer is easily to be cracked when the gate insulation layer is deposited on the gate is effectively solved, avoiding the risk of exposure of the gate due to cracking of the gate insulation layer, and moreover, by forming the trench with the open area thereof proximal to the insulation layer being larger than that distal to the insulation layer in the photoresist layer using the back exposure process, and by a cooperation of the stripping process, a pattern of the gate layer is formed without an exposure, a development and an etching process, resulting in a reduction of processes and cost, thus, the manufacturing method of the pixel structure is simple to be implemented, has a universal applicability, is easy to be used in an actual production to achieve a large-scale production, and can effectively improve production efficiency.

BRIEF DESCRIPTION OF THE DRAWINGS

FIG. 4A through FIG. 4G show structural diagrams corresponding to the flow chart of the manufacturing method for manufacturing the pixel structure shown in FIG. 2, and wherein:

FIG. 4A shows a structural diagram of forming an insulation layer and a photoresist layer;

FIG. 4B shows a diagram of performing a back exposure process on a basis of FIG. 4A;

FIG. 4C shows a structural diagram of forming a trench in the photoresist layer on a basis of FIG. 4B;

FIG. 4D shows a structural diagram of forming a slot in the insulation layer on a basis of FIG. 4C;

FIG. 4E shows a structural diagram of forming a metal layer on a basis of FIG. 4D;

FIG. 4F shows a structural diagram of forming a gate layer on a basis of FIG. 4E;

FIG. 4G shows a structural diagram of a finally formed pixel structure on a basis of FIG. 4F.

DETAILED DESCRIPTION OF THE EMBODIMENTS

Figure 1:
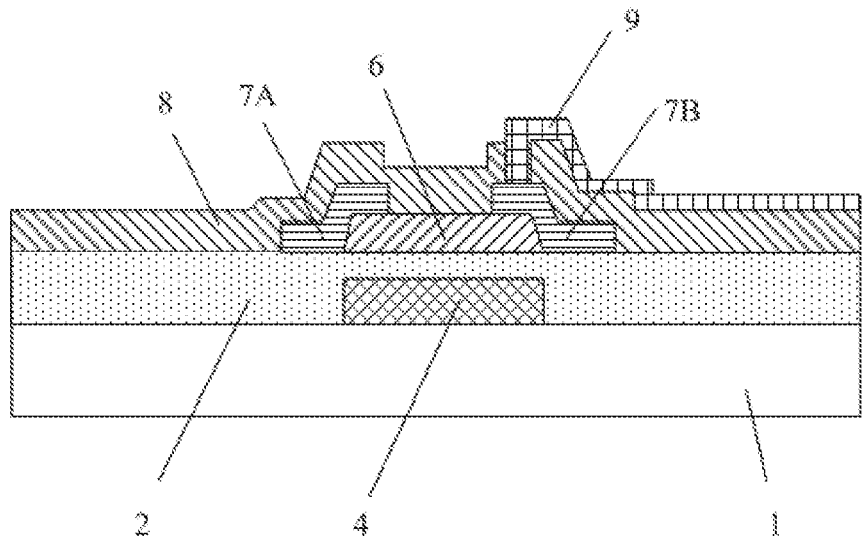
FIG. 1 shows a structural diagram of a pixel structure in the prior art.

In order to make a person skilled in the art understand technical solutions of the present invention better, the pixel structure and the manufacturing method thereof, the array substrate and the display apparatus of the present invention will be described in detail below in conjunction with accompanying drawings and embodiments.

A conception of the present invention is that, by analyzing performances of many products formed by an exposure process, the inventor found that, in the exposure process, due to scattering of light, a trench formed in a photoresist layer by an exposure step and a development step has an open area at a side proximal to a light source larger than that at another side distal to the light source.

In the present invention, under a phenomenon that the trench formed in the photoresist layer by the exposure process mentioned above has an open area at a side proximal to a light source larger than that at another side distal to the light source, by a cooperation of a stripping process, two layer structures in the pixel structure, which need to be formed by two independent patterning processes respectively and may have a level difference therebetween, are formed by a single exposure process, development process and patterning process, thereby, compared with the manufacturing method of the pixel structure in the prior art, the manufacturing method of the pixel structure in the present invention not only can effectively solve, for example, the problem existing in the prior art that a gate insulation layer is easily to be cracked when the gate insulation layer is deposited on a gate, avoiding a risk of exposure of the gate due to cracking of the gate insulation layer, but also can reduce one time of patterning process.

First Embodiment

The present embodiment provides a pixel structure and a manufacturing method thereof, the manufacturing method is simple and easy to be implemented, the pixel structure manufactured by the manufacturing method has a good yield and a good performance.

The manufacturing method of the pixel structure provided by the present embodiment comprises steps of: successively forming an insulation layer and a photoresist layer on a transparent substrate; performing an exposure and a development on the photoresist layer by a back exposure process, so as to form a trench in the photoresist layer, an open area of the trench proximal to the insulation layer is larger than that of the trench distal to the insulation layer; removing a portion of insulation material in a region of the insulation layer exposed through the trench by an etching process, so as to form a slot in the insulation layer; forming a metal layer on a side of the photoresist layer distal to the insulation layer, a portion of the metal layer is embedded in the slot;

removing the photoresist layer and the metal layer thereon by a stripping process, and retaining the portion of the metal layer in the slot.

The pixel structure manufactured by the manufactured method mentioned above comprises the insulation layer and the metal layer embedded in the slot of the insulation layer.

In the present embodiment, the pixel structure may comprise a thin film transistor, for example, a top gate thin film transistor, wherein, the insulation layer is a gate insulation layer of the thin film transistor, the metal layer is a gate layer of the thin film transistor, for example, an active layer and a source and drain layer are further successively provided above the gate insulation layer (i.e., on a side of the gate insulation layer distal to the transparent substrate). Generally, the transparent substrate may be a glass substrate.

Figure 2:
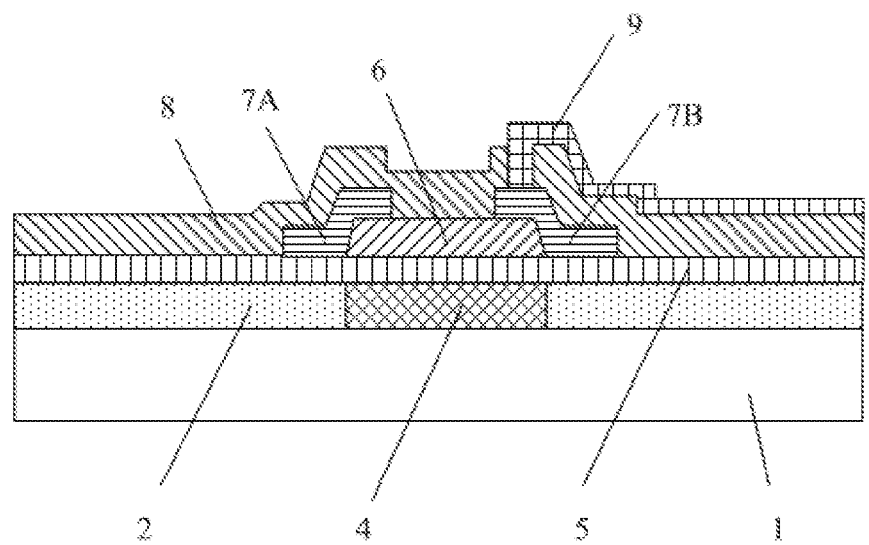
FIG. 2 shows a structural diagram of a pixel structure in a first embodiment of the present invention.

As shown in FIG. 2, the thin film transistor in the pixel structure comprises a gate layer 4, a gate insulation layer 2, an active layer 6, an auxiliary gate insulation layer 5, a source 7A and a drain 7B. The thin film transistor may also comprise a passivation layer 8 and a pixel electrode layer 9 to form the pixel structure. The manufacturing method of the pixel structure in the present embodiment will be described in detail below by taking forming the gate insulation layer in the thin film transistor and the gate layer embedded in the gate insulation layer as an example.

Figure 3:
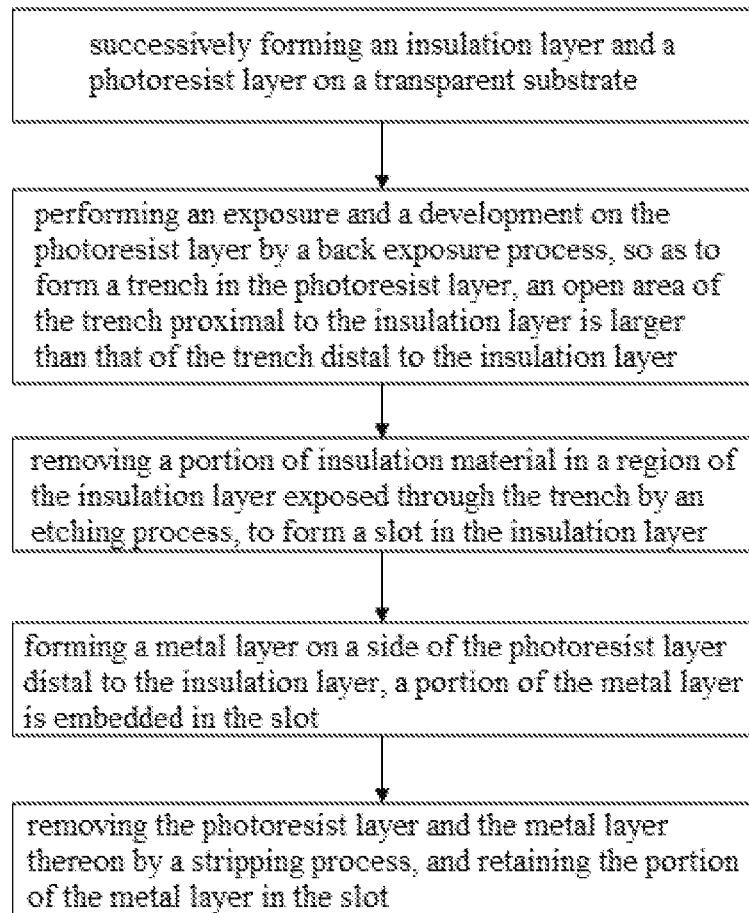
FIG. 3 shows a flow chart diagram of a manufacturing method of the pixel structure in the first embodiment of the present invention.

In the present embodiment, the photoresist layer may be a transparent layer. As shown in FIG. 3, the manufacturing method of the pixel structure comprises steps S1 through S5.

Step S1, successively forming the insulation layer and the photoresist layer on the transparent substrate.

Figure 4A:
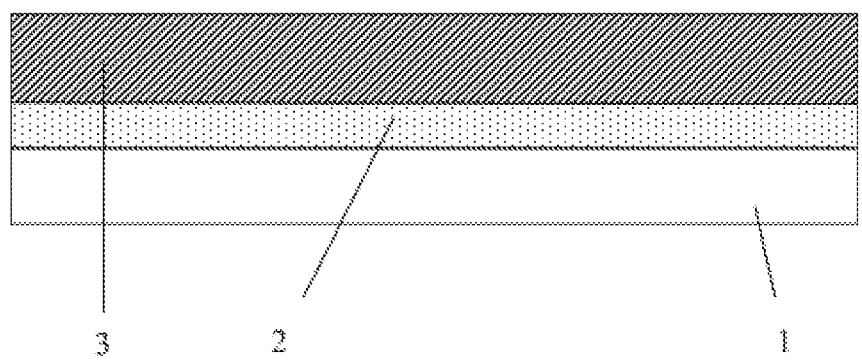

As shown in FIG. 4A, on the transparent substrate, the insulation layer 2 and the photoresist layer 3 are successively formed by for example depositing and coating respectively. Here, the insulation layer 2 is the gate insulation layer 2, and generally, the gate insulation layer 2 is formed of silicon oxide, silicon nitride, hafnium oxide, silicon nitride, or aluminum oxide, the photoresist layer 3 is formed on a side of the gate insulation layer 2 distal to the transparent substrate 1.

Generally, the transparent substrate 1 is a glass substrate.

Step S2, performing an exposure and a development on the photoresist layer by using a back exposure process, so as to form a trench in the photoresist layer, an open area of the trench proximal to the insulation layer is larger than that of the trench distal to the insulation layer.

Figure 4B:
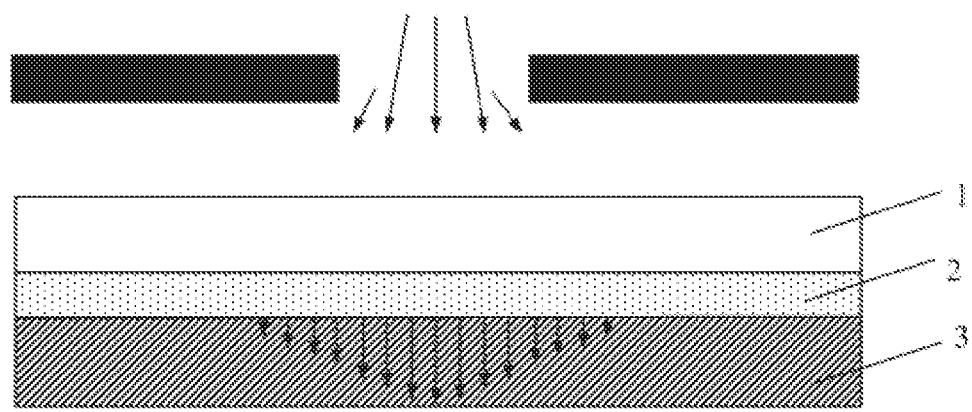
Figure 4C:
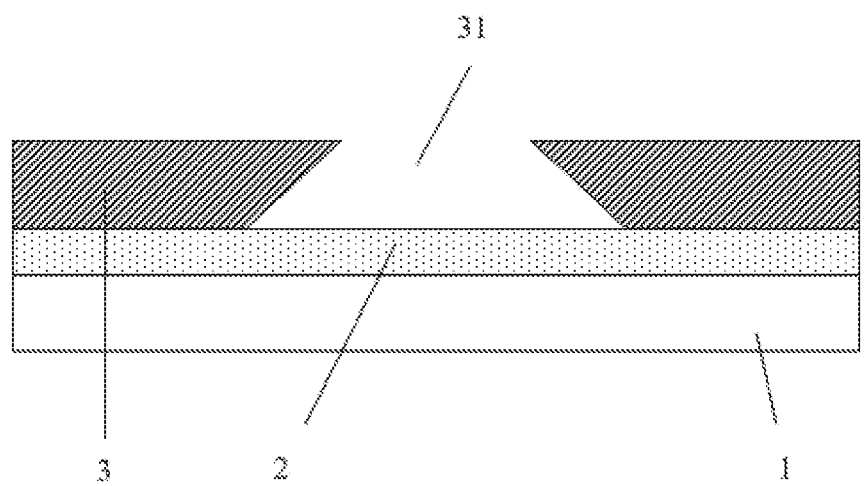

As shown in FIG. 4B, during the back exposure process, the insulation layer 2 is closer to an exposure light source than the photoresist layer 3. As shown in FIG. 4C, a trench 31 is formed in the photoresist layer 3, and an open area of the trench 31 proximal to the insulation layer 2 is larger than that of the trench 31 distal to the insulation layer 2, that is to say, the trench 31 is formed so that a cross section shape thereof along a plane perpendicular to a plane of the transparent substrate 1 is a trapezoid, as shown in FIG. 4C.

In the present embodiment, in the back exposure process, the exposure may be performed by using a full-transmission mask plate, so that the cross section shape of the trench 31 along the plane perpendicular to the plane of the transparent substrate 1 is a trapezoid, and the trapezoid has two twists of straight lines. The cross section shape of the trench 31 along the plane perpendicular to the plane of the transparent substrate 1 may be an isosceles trapezoid, and the isosceles trapezoid has two waists of straight lines.

In order to perform the back exposure process, the transparent substrate 1 should be turned over after finishing of the step S1, as shown in FIG. 4B, so that the transparent substrate 1 and the insulation layer 2 are closer to the exposure light source than the photoresist layer 3. At this time, if the exposure light source is placed at a center position of a light transmission region of the mask plate, while performing the exposure, an intensity of light at the center position of the light transmission region of the mask plate is the strongest, and the intensity of light in a region of the light transmission region gradually transited from the center position to an edge is more and more weak, the intensity of light received by the photoresist layer 3 is distributed with a strong intensity at the center position and a weak intensity at the edge, as shown in FIG. 4B. After a further development process, the trench 31, the cross section shape of which along the plane perpendicular to the plane of the transparent substrate 1 is an isosceles trapezoid, is formed in the photoresist layer 3, and the transparent substrate 1 should be turned over, as shown in FIG. 4C.

S3, removing a portion of insulation material in a region of the insulation layer exposed through the trench by an etching process, so as to form a slot in the insulation layer.

Figure 4D:
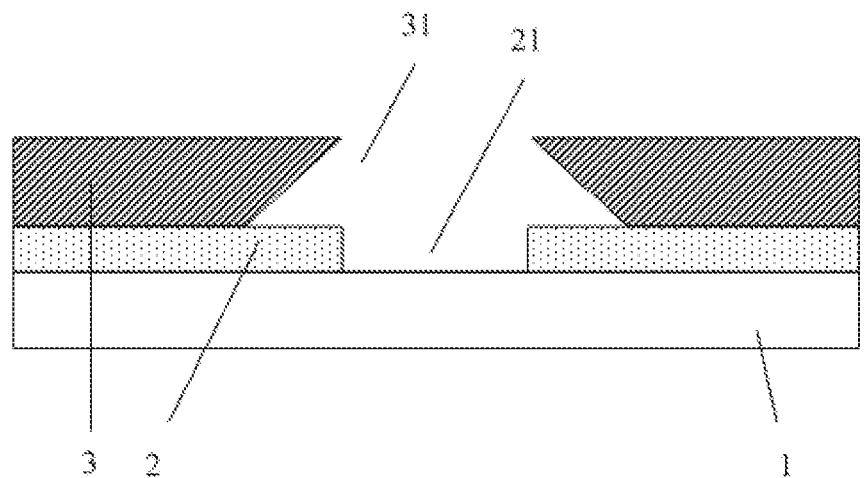

In this step, as shown in FIG. 4D, the etching process is performed in a corresponding etching mode adopted according to properties of insulation material of the insulation layer 2, for example, a dry etching process is performed on the insulation layer 2, so as to form a slot 21 in the insulation layer 2, for example, the etching performed in the slot 21 is mainly a physical bombardment so as to ensure that the cross section shape of the slot 21 along the plane perpendicular to the plane of the transparent substrate 1 is substantially a rectangle, that is, side walls of the slot 21 are perpendicular to the plane of the transparent substrate 1.

Step S4, forming a metal layer on a side of the photoresist layer distal to the insulation layer, a portion of the metal layer is embedded in the slot.

Figure 4E:
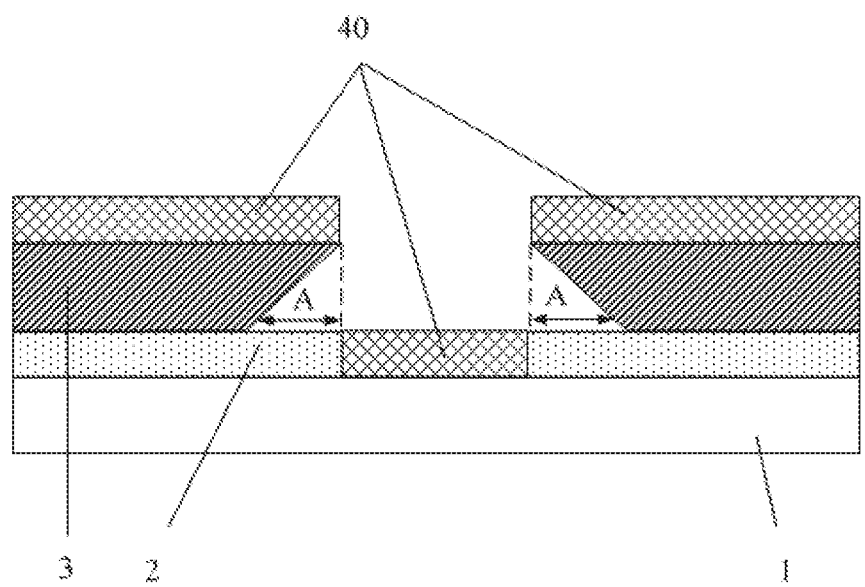

In this step, as shown in FIG. 4E, a metal layer 40 is formed above the photoresist layer 3 formed with the trench 31 therein by for example sputtering. Here, specifically, for example, a gate metal layer 40 is deposited. Under an effect of gravity, since the photoresist layer 3 is formed with the trench 31 therein, the gate metal layer 40 is easy to be cracked during depositing, a portion thereof is located above the photoresist layer 3, and another portion thereof falls into the trench 31, so as to form in the slot 21 in the gate insulation layer 3, the portion of the gate metal layer in the slot 21 is separated from other portions of the metal layer.

S5, removing the photoresist layer and the metal layer thereon by a stripping process, and retaining the portion of the metal layer in the slot.

Figure 4F:
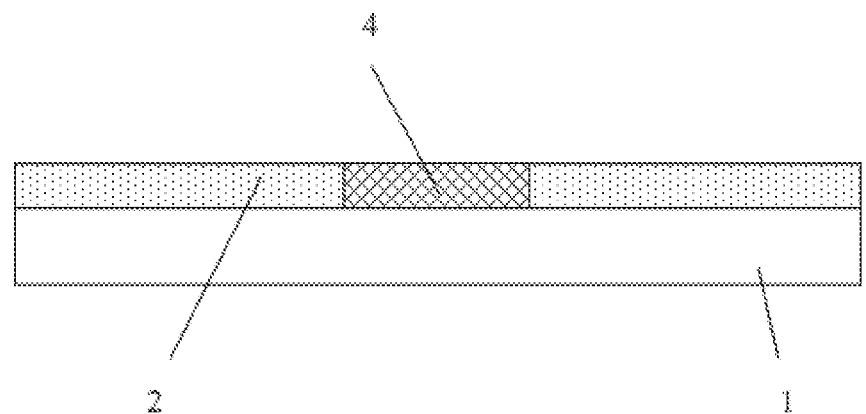

In the step S5, the pattern of the gate layer 4 embedded in the gate insulation layer 2 as shown in FIG. 4F is formed by only stripping off the photoresist layer 3 and the portion of the metal layer on the photoresist layer 3, there is no need to perform an exposure, a development and an etching process on the gate metal layer 40, resulting in an improved production efficiency.

Specifically, as shown in FIGS. 4D and 4E, since the open area of the trench 31 distal to the gate insulation layer 2 is smaller than that of the trench 31 proximal to the gate insulation layer 2, after forming the slot 21 in the gate insulation layer 2 by etching the gate insulation layer 2, the photoresist layer 3 may not be removed so that the gate metal layer 40 is directly deposited above the photoresist layer 3. Due to existing of the trench 31, a portion of the deposited gate metal layer 40 falls into the slot 21 in the gate insulation layer 2, thereby the gate layer 4 embedded in the gate insulation layer 2 is formed by only stripping off the photoresist layer 3 and the portion of the gate metal layer thereon, and there is no need to perform an exposure, a development and an etching process on the gate metal layer 40, significantly simplifying the process.

It should be understood that, as shown in FIG. 4E, since the open area of the trench 31 proximal to the gate insulation layer 2 is larger than that of the trench 31 distal to the gate insulation layer 2, while depositing the gate metal layer 40 above the photoresist layer 3, a certain gap (distance A in FIG. 4E) is formed between the portion of the gate metal layer falling into the trench 31 and embedded in the slot 21 and the portion of the photoresist layer as side walls of the trench 31, thus, during the stripping process, the photoresist layer to be removed and the portion of the gate metal layer, embedded in the slot 21, to be retained are separated from each other, the photoresist layer 3 and the portion of the gate metal layer on the photoresist layer 3 can be removed completely.

In the manufacturing method of the pixel structure in the present embodiment, an auxiliary gate insulation layer 5 is further provided above the gate insulation layer 2 and the gate layer 4, the auxiliary gate insulation layer 5 may be formed of a material that is the same as that of the gate insulation layer 2 and completely covers the gate insulation layer 2 and the gate layer 4, so as to achieve a better gate insulation effect, thereby to ensure that the gate layer 4 is independent (i.e., insulated) from the active layer 6, the source 7A and the drain 7B to be formed subsequently.

FIG. 4E shows a relatively ideal deposition effect, that is, the gate layer 4 formed in FIG. 4E is exactly located in the slot 21, and there is no excess deposition on the gate insulation layer 2 in the trench 31. However, after providing the auxiliary gate insulation layer 5, even if the gate metal layer 40 is also deposited on the gate insulation layer 2 in the trench 31 besides in the slot 21 due to accuracy of process control parameters, as long as the auxiliary gate insulation layer 5 completely covers the gate layer 4, the gate layer 4 can be ensured to be independent (i.e., insulated) from the active layer 6, the source 7A and the drain 7B to be formed subsequently, which reduces the requirement for accuracy of the deposition process.

In the present embodiment, the auxiliary gate insulation layer 5 may be formed only by a film forming process, and no other process is involved, thus the difficulty of the process is substantially not be increased. Further, if there is a limit for a thickness of the thin film transistor in the pixel structure, the auxiliary gate insulation layer 5 may be thinned, so that a thickness of the gate insulation layer 2 maintains unchanged. In this way, not only an increase of the risk of cracking of the gate insulation layer 2 due to reducing of the thickness thereof is avoided, but also the case of prior art that the thickness of the gate insulation layer 2 is deliberately increased so as to prevent cracking is avoided, resulting in that an array substrate comprising the pixel structure of the present embodiment is relatively thin and light in weight, and the possibility of realizing a thin display panel is guaranteed.

Figure 4G:
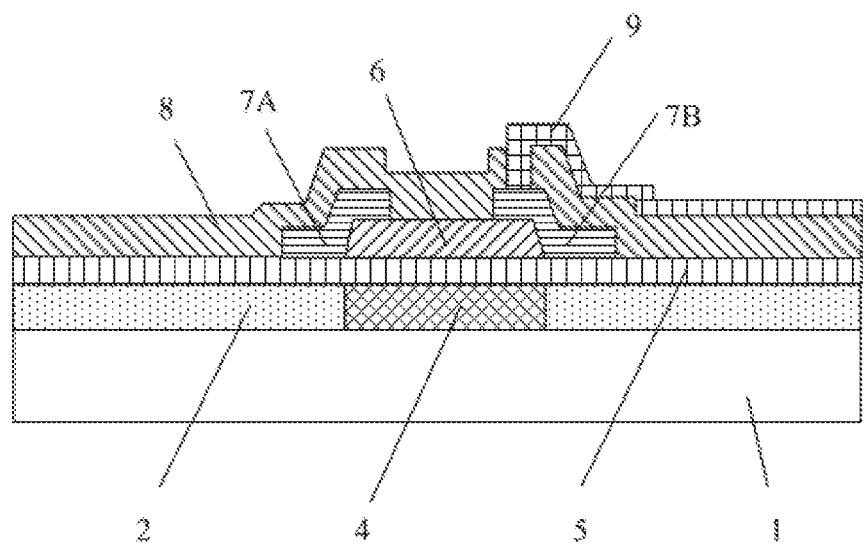

It should be understood that, the manufacturing method of the pixel circuit of the present embodiment further comprises steps of forming the active layer 6, the source 7A and the drain 7B etc., and steps of forming the passivation layer 8 and the pixel electrode layer 9 etc. on the thin film transistor, these will not be described in detail here. FIG. 4G schematically shows a structural diagram of the finally formed pixel structure of the present embodiment.

In the manufacturing method of the pixel structure in the present invention, the photoresist layer 3 is exposed by the back exposure process so that the trench 31, the open area of which distal to the gate insulation layer 2 is smaller than that proximal to the gate insulation layer 2, is formed in the photoresist layer 3, and then the gate insulation layer 2 is etched, so that the slot 21 is formed in the gate insulation layer 2, and the gate metal layer 40 is further deposited above the photoresist layer 3, a portion of the gate metal layer 40 falls into the trench 31 and is embedded in the slot 21, then, the undesired portion of the gate metal layer outside of the slot 21 (i.e., on the photoresist layer 3) and the photoresist layer 3 are removed together by stripping off the photoresist layer 3, the gate layer 4 in the slot 21 is retained, thereby there is no need to bring in an additional patterning process (for example, exposure, development and etching process) for forming a pattern of the gate layer 4, significantly simplifying the manufacturing method of the pixel structure.

If a manufacturing method of a semiconductor in the prior art is used, although the effect that the gate layer 4 is embedded in the gate insulation layer 2 may be achieved, according to the existing manufacturing method of the semiconductor, it needs two patterning processes to embed the gate layer 4 into the gate insulation layer 2, one is to form a pattern of the gate insulation layer 2 comprising the slot 21, and the other is to form a pattern of the gate layer 4, which will increase the cost, and also increase the difficulty of the process, resulting in a loss more than a gain.

In the pixel structure and the manufacturing method thereof in the present embodiment, the gate layer is embedded in the gate insulation layer by only a single patterning process, not only the risk of cracking of the gate insulation layer at edges of the gate layer due to the level difference between the gate layer and the gate insulation layer in the thin film transistor of the pixel structure is reduced, but also the gate layer is formed without a patterning process, resulting in a simple process, a reduction of cost, an improved efficiency, and also an improved yield of the formed pixel structure.

Second Embodiment

The present embodiment provides a pixel structure and a manufacturing method thereof, the manufacturing method is simple, and the pixel structure manufactured by the manufacturing method has a good yield and a good performance.

The manufacturing method of the pixel structure in the present embodiment will also be described in detail below by taking forming the gate insulation layer 2 in the thin film transistor and the gate layer 4 embedded in the gate insulation layer 2 as an example. Compared with the first embodiment, the difference of the manufacturing method of the pixel structure in the present embodiment is that, while forming the trench 31 in the photoresist layer 3, during the back exposure process, the exposure is performed by using a semi-transmission mask plate, so that the cross section shape of the trench 31 along the plane perpendicular to the plane of the transparent substrate is a trapezoid, and the trapezoid has two waists of arc lines, the arc lines protrude toward an inside of the trench 31. The cross section shape of the trench 31 along the plane perpendicular to the plane of the transparent substrate 1 may be an isosceles trapezoid, and the isosceles trapezoid has two waists of arc lines.

Figure 5A:
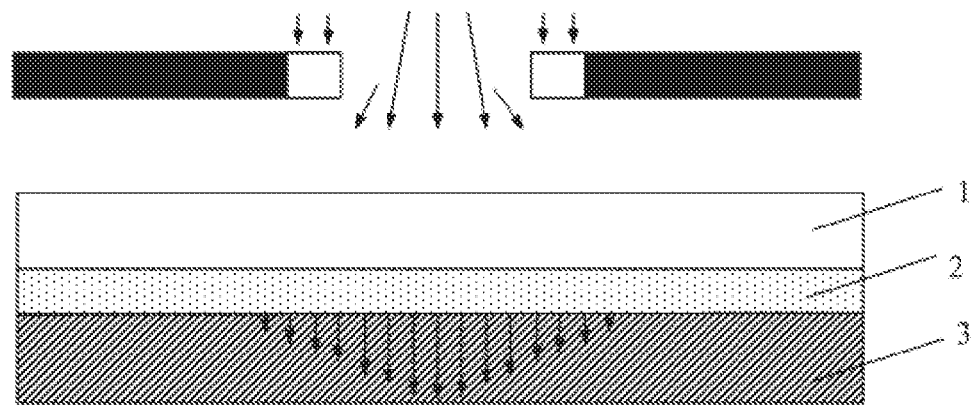
FIG. 5A shows a diagram of performing the back exposure process in a second embodiment of the present invention.
Figure 5B:
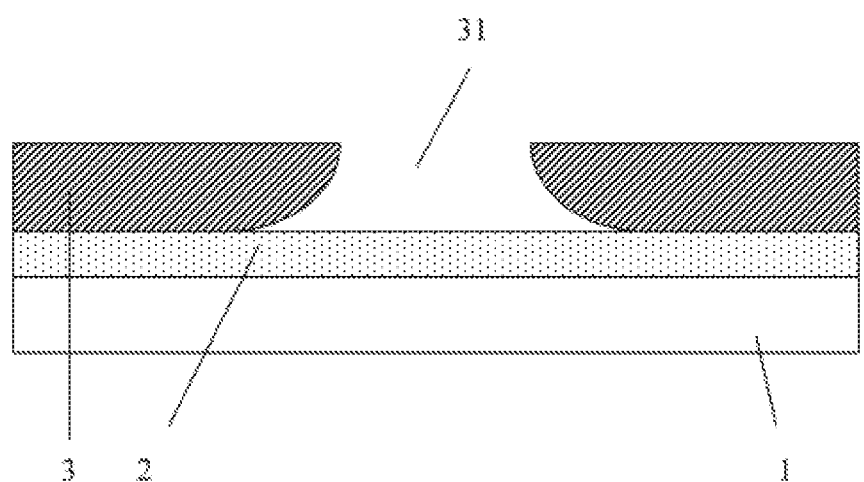
FIG. 5B shows a structural diagram of forming the trench in the photoresist layer on a basis of FIG. 5A.
Figure 6:
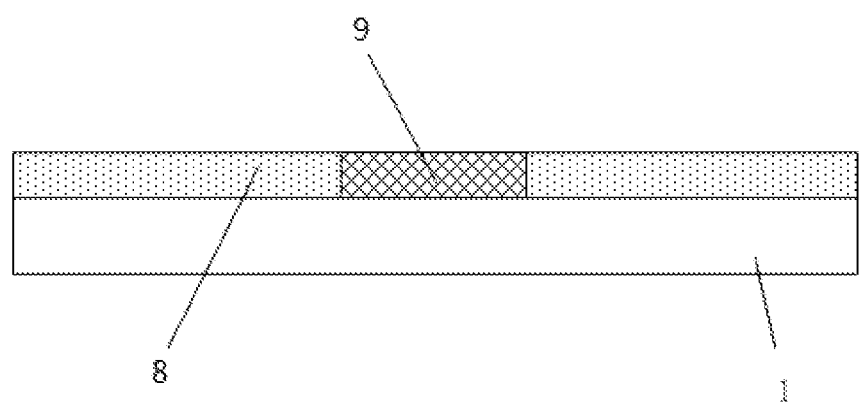
FIG. 6 shows a structural diagram of forming a pixel electrode layer embedded in a passivation layer.

Specifically, while performing the exposure in the manufacturing method of the pixel structure in the present embodiment, the semi-transmission mask plate as shown in FIG. 5A is employed, that is, a full-transmission film at edges of the full-transmission mask plate in the first embodiment is replaced by a semi-transmission film, so that sides of the cross section shape of the trench 31 along the plane perpendicular to the plane of the transparent substrate 1 are not straight lines, but are arc lines as shown in FIG. 5B, under a condition that the pattern of the finally formed gate layer 4 is not be affected, a risk of collapsing of the photoresist layer 3 at the open of the trench 31 is avoided.

In the pixel structure and the manufacturing method thereof in the present embodiment, the gate layer is also embedded in the gate insulation layer by only a single patterning process, not only the risk of cracking of the gate insulation layer at edges of the gate layer due to the level difference between the gate layer and the gate insulation layer in the thin film transistor of the pixel structure is reduced, but also the gate layer is formed without a patterning process, resulting in a simple process, a reduction of cost, an improved efficiency, and also an improved yield of the formed pixel structure.

Third Embodiment

The present embodiment provides a pixel structure and a manufacturing method thereof, the manufacturing method is simple, and the pixel structure manufactured by the manufacturing method has a good yield and a good performance.

Compared with the first embodiment and the second embodiment, the difference of the manufacturing method of the pixel structure in the present embodiment is that, the manufacturing method of the pixel structure in the present embodiment will be described in detail below by taking forming the passivation layer 8 and the pixel electrode layer 9 embedded in the passivation layer 8 as an example.

In the pixel structure of the present embodiment, the insulation layer and the metal layer embedded in the insulation layer are the passivation layer 8 and the pixel electrode layer 9 embedded in the passivation layer 8 respectively. In this case, in order to ensure effectiveness of the back exposure process, the passivation layer 8 and the pixel electrode layer 9 may be first formed on the transparent substrate 1, and then the thin film transistor is formed above the passivation layer 8 and the pixel electrode layer 9, that is to say, the thin film transistor in the pixel structure manufactured by the manufacturing method of the pixel structure in the present embodiment is located on a side of the passivation layer 8 and the pixel electrode layer 9 distal to the transparent substrate 1.

As seen from the first embodiment through the third embodiment, in the manufacturing method of the pixel structure in the present embodiment, the insulation layer and the metal layer embedded in the insulation layer not only may be the gate insulation layer 2 and the gate layer 4 respectively, but also may be the passivation layer 8 and the pixel electrode layer 9 respectively. It should be understood that, as long as the back exposure process is performed through the transparent substrate, and by cooperation of the stripping process, the manufacturing method of the pixel structure in the present invention may also be applied to form other layer structures of a semiconductor device which are similar to combinations of the gate insulation layer 2 and the gate layer 4, or the passivation layer 8 and the pixel electrode layer 9, which will not be limited herein.

In the manufacturing method of the pixel structure in the first embodiment through the third embodiment, the insulation layer and the metal layer embedded in the insulation layer are prepared by using the back exposure process, there is no need to bring in an additional mask plate and an additional patterning process, for example, the problem existing in the prior art that the gate insulation layer is easily to be cracked when the gate insulation layer is deposited on the gate layer is effectively solved, avoiding the risk of exposure of the gate due to cracking of the gate insulation layer, and moreover, by forming the trench with the open area proximal to the insulation layer being larger than that distal to the insulation layer in the photoresist layer using the back exposure process, and by a cooperation of the stripping process, a pattern of the gate layer is formed without an exposure, a development and an etching process, resulting in a reduction of processes and cost, thus, the manufacturing method of the pixel structure is simple to be implemented, has a universal applicability, is easy to be used in an actual production to achieve a large-scale production, and can effectively improve production efficiency.

Fourth Embodiment

The present embodiment provides an array substrate comprising the pixel structure manufactured by the manufacturing method of any of the first embodiment through the third embodiment.

The array substrate comprises a plurality of pixel structures arranged in a matrix. By using the pixel structure manufactured by the manufacturing method of any of the above embodiments, the manufacturing process of the array substrate is simple and results in a good yield.

Fifth Embodiment

The present embodiment provides a display apparatus comprising the array substrate of the fourth embodiment.

The display apparatus may be any product or component with a display function, such as a liquid crystal panel, an electronic paper, an organic light emission display panel, a mobile phone, a flat panel computer, a television, a display, a notebook computer, a digital photo frame, a navigator, or the like.

The display apparatus of the present embodiment has a good display effect and a long life time.

It should be understood that, the above embodiments are merely exemplary embodiments for explaining a principle of the present invention, but the present invention is not limited thereto. Various modifications and improvements may be made by those ordinary skilled in the art within the spirit and essence of the present invention, these modifications and improvements also fall into the protection scope of the present invention.

The invention claimed is:

1. A manufacturing method of a pixel structure comprising an insulation layer and a metal layer, the manufacturing method comprising steps of:
   successively forming the insulation layer and a photoresist layer on a transparent substrate;
   performing an exposure and a development on the photoresist layer by a back exposure process, so as to form a trench in the photoresist layer, an open area of the trench proximal to the insulation layer is larger than that of the trench distal to the insulation layer;
   removing a portion of insulation material in a region of the insulation layer exposed through the trench by an etching process, so as to form a slot in the insulation layer;
   depositing the metal layer on a side of the photoresist layer distal to the insulation layer, a portion of the metal layer is embedded in the slot, and the portion of the metal layer embedded in the slot has a thickness substantially equal to that of the insulation layer;

removing the photoresist layer and the metal layer thereon by a stripping process, and retaining the insulation layer and the portion of the metal layer in the slot of the insulation layer, wherein during the back exposure process, a semi-transmission mask plate is used for performing the exposure, so that the cross section shape of the trench along the plane perpendicular to the plane of the transparent substrate is a trapezoid, and the trapezoid has two waists of arc lines, the arc lines protrude toward an inside of the trench.

2. The manufacturing method of claim 1, wherein the photoresist layer is a transparent layer.

3. The manufacturing method of claim 1, wherein, during the back exposure process, a full-transmission mask plate is used for performing the exposure, so that a cross section shape of the trench along a plane perpendicular to a plane of the transparent substrate is a trapezoid, and the trapezoid has two waists of straight lines.

4. The manufacturing method of claim 3, wherein the cross section shape of the trench along the plane perpendicular to the plane of the transparent substrate is an isosceles trapezoid, and the isosceles trapezoid has two waists of straight lines.

5. The manufacturing method of claim 1, wherein the cross section shape of the trench along the plane perpendicular to the plane of the transparent substrate is an isosceles trapezoid, and the isosceles trapezoid has two waists of arc lines.

6. The manufacturing method of claim 1, wherein, the pixel structure comprises a thin film transistor, the insulation layer is a gate insulation layer of the thin film transistor, the portion of the metal layer embedded in the slot of the insulation layer is a gate layer of the thin film transistor, an active layer and a source and drain layer are further successively provided above the gate insulation layer.

7. The manufacturing method of claim 6, wherein, an auxiliary gate insulation layer is further provided between the gate insulation layer and the active layer, the auxiliary gate insulation layer is formed of a material that is the same as that of the gate insulation layer and completely covers the gate insulation layer and the gate layer.

8. The manufacturing method of claim 1, wherein, the pixel structure comprises a thin film transistor, a pixel electrode layer and a passivation layer, the insulation layer is the passivation layer, and the portion of the metal layer embedded in the slot of the insulation layer is the pixel electrode layer.

9. A pixel structure manufactured by the manufacturing method of claim 1, comprising an insulation layer and a metal layer embedded in a slot of the insulation layer, the portion of the metal layer embedded in the slot of the insulation layer has a thickness substantially equal to that of the insulation layer.

10. The pixel structure of claim 9, further comprising a thin film transistor, the insulation layer is a gate insulation layer of the thin film transistor, the metal layer embedded in the slot of the insulation layer is a gate layer of the thin film transistor, an active layer and a source and drain layer are further successively provided above the gate insulation layer.

11. The pixel structure of claim 10, wherein, an auxiliary gate insulation layer is further provided between the gate insulation layer and the active layer, the auxiliary gate insulation layer is formed of a material that is the same as that of the gate insulation layer and completely covers the gate insulation layer and the gate layer.

12. The pixel structure of claim 9, further comprising a thin film transistor, a pixel electrode layer and a passivation layer, the insulation layer is the passivation layer, and the metal layer embedded in the slot of the insulation layer is the pixel electrode layer.

13. An array substrate, comprising the pixel structure of claim 9.

14. A display apparatus, comprising the array substrate of claim 13.

* * * * *